United States Patent
Deng et al.

(10) Patent No.: US 11,747,927 B2
(45) Date of Patent: Sep. 5, 2023

(54) DISPLAY PANEL AND DISPLAY DEVICE

(71) Applicant: KUNSHAN GO-VISIONOX OPTO-ELECTRONICS CO., LTD, Jiangsu (CN)

(72) Inventors: Xianzhu Deng, Kunshan (CN); Shuihu Xiong, Kunshan (CN); Kai Feng, Kunshan (CN); Chia-huan Chang, Kunshan (CN)

(73) Assignee: KUNSHAN GO-VISIONOX OPTO-ELECTRONICS CO., LTD, Kunshan (CN)

( * ) Notice: Subject to any disclaimer, the term of this patent is extended or adjusted under 35 U.S.C. 154(b) by 9 days.

(21) Appl. No.: 17/473,041

(22) Filed: Sep. 13, 2021

(65) Prior Publication Data

US 2021/0405801 A1    Dec. 30, 2021

Related U.S. Application Data

(63) Continuation of application No. PCT/CN2020/079256, filed on Mar. 13, 2020.

(30) Foreign Application Priority Data

Jul. 30, 2019   (CN) .......................... 201910696833.9

(51) Int. Cl.
*G06F 3/041* (2006.01)
*H10K 50/84* (2023.01)

(52) U.S. Cl.
CPC ......... *G06F 3/0412* (2013.01); *H10K 50/841* (2023.02)

(58) Field of Classification Search
None
See application file for complete search history.

(56) References Cited

U.S. PATENT DOCUMENTS

| | | | |
|---|---|---|---|
| 2016/0188059 A1* | 6/2016 | Lee ........................ | G06F 3/0412 345/173 |
| 2017/0277313 A1* | 9/2017 | Lee ........................ | G06F 3/0412 |
| | (Continued) | | |

FOREIGN PATENT DOCUMENTS

| | | |
|---|---|---|
| CN | 101064989 A | 10/2007 |
| CN | 103885235 A | 6/2014 |
| | (Continued) | |

OTHER PUBLICATIONS

International Search Report dated Jun. 22, 2020 in corresponding International application No. PCT/CN2020/079256 ; 4 pages.

(Continued)

*Primary Examiner* — Christopher R Lamb
(74) *Attorney, Agent, or Firm* — Maier & Maier, PLLC

(57) ABSTRACT

A display panel includes a first substrate, a light-emitting function layer, a second substrate, an optical adhesive layer and a polarizer stacked in sequence. The display panel further includes a touch-control driving plate disposed on a surface of a first portion of the second substrate facing away from the light-emitting function layer. The first portion of the second substrate is in the non-display area. The optical adhesive layer covers a second portion of the touch-control driving plate. The second portion of the touch-control driving plate covered by the optical adhesive layer includes a thinned portion and a non-thinned portion. Along a first direction of the display area to the touch-control driving plate, the thinned portion and the non-thinned portion are arranged in sequence; a thickness of the thinned portion is less than a thickness of the non-thinned portion.

17 Claims, 5 Drawing Sheets

(56) References Cited

U.S. PATENT DOCUMENTS

| | | |
|---|---|---|
| 2019/0102002 A1 | 4/2019 | Lee et al. |
| 2019/0198801 A1* | 6/2019 | Kuon ................. H10K 59/1213 |
| 2020/0057528 A1* | 2/2020 | Liu ....................... G06F 3/0443 |

FOREIGN PATENT DOCUMENTS

| | | |
|---|---|---|
| CN | 107422553 A | 12/2017 |
| CN | 108427519 A | 8/2018 |
| CN | 108563363 A | 9/2018 |
| CN | 108831917 A | 11/2018 |
| CN | 109032417 A | 12/2018 |
| CN | 109254696 A | 1/2019 |
| CN | 109524433 A | 3/2019 |
| CN | 110262701 A | 9/2019 |
| KR | 20190037672 A | 4/2019 |

OTHER PUBLICATIONS

First Office Action and Search Report dated Jan. 26, 2021 in corresponding Chinese application No. 201910696833.9; 16 pages including Machine-generated English-language translation.
Second Office Action and Search Report dated Jun. 22, 2021 in corresponding Chinese application No. 201910696833.9; 15 pages including Machine-generated English-language translation.

* cited by examiner

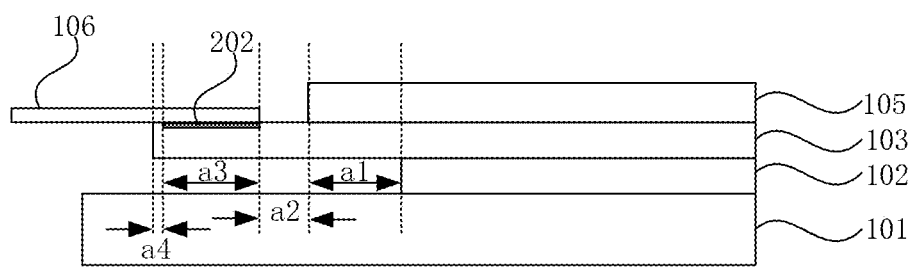
FIG. 1 – PRIOR ART
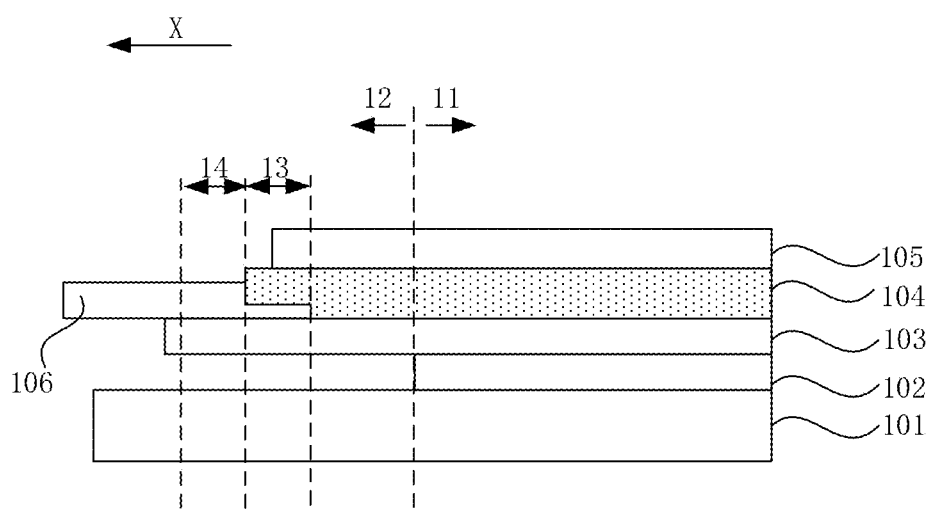
FIG. 2

DISPLAY PANEL AND DISPLAY DEVICE

CROSS-REFERENCE TO RELATED APPLICATION

This is a continuation of International Patent Application NO. PCT/CN2020/079256, filed on Mar. 13, 2020, which claims priority to Chinese patent application No. 201910696833.9 filed on Jul. 30, 2019, disclosures of which are incorporated herein by reference in their entireties.

TECHNICAL FIELD

Embodiments of the present disclosure relate to a technology of narrow bezel, in particular to a display panel and a display device.

BACKGROUND

As the display technology progresses, a "truly full screen" becomes a goal that many display panel manufacturers pursuit.

However, a display panel in the related technology still has a relatively large bezel and a relatively small screen-to-body ratio.

SUMMARY

The present disclosure provides a display panel and a display device to reduce a bezel of the display panel and improve a screen-to-body ratio of the display panel.

The present disclosure provides a display panel, the display panel includes a first substrate, a light-emitting functional layer, a second substrate, an optical adhesive layer and a polarizer stacked in sequence;

the display panel includes a display area and a non-display area located on at least one side of the display area; the display panel further includes a touch-control driving plate disposed on a surface of a first portion of the second substrate facing away from the light-emitting functional layer, the first portion of the second substrate is in the non-display area; the optical adhesive layer covers a second portion of the touch-control driving plate;

the second portion of the touch-control driving plate covered by the optical adhesive layer includes a thinned portion and a non-thinned portion, along a first direction of the display area to the touch-control driving plate, the first direction is a direction perpendicular to an edge of the touch-control driving plate adjacent to the display area, the thinned portion and the non-thinned portion are arranged in sequence, and the thinned portion extends to the edge of the touch-control driving plate adjacent to the display area; along a second direction perpendicular to the second substrate, a thickness of the thinned portion of the touch-control driving plate is less than a thickness of the non-thinned portion of the touch-control driving plate.

The present disclosure provides a display device. The display device includes the above-mentioned display panel.

In embodiments of the present disclosure, the optical adhesive layer covers a second portion of the touch-control driving plate. That is, a distance between a surface of the optical adhesive layer facing away from the second substrate and the second substrate is greater than a distance between a surface of the touch-control driving plate facing away from the second substrate and the second substrate. Since the polarizer is attached to the optical adhesive layer, the attaching surface between the polarizer and the optical adhesive layer is higher than the surface of the touch-control driving plate facing away from the second substrate. When the polarizer is attached to the surface of the optical adhesive layer, an edge of the polarizer will not collide with the touch-control driving plate, that is, there is no need to reserve a preset distance between the touch-control driving plate and the polarizer to avoid interference between the binding process of the touch-control driving plate and the attaching process of the polarizer. That is, along a direction parallel to the second substrate, a distance between the polarizer and the touch-control driving plate 1 may be less than the preset distance, alternatively, the vertical projection of the polarizer on the second substrate may partially overlap the vertical projection of the touch-control driving plate on the second substrate. In this manner, the bezel of the display panel is reduced, and the screen-to-body ratio of the display panel is improved. Moreover, the touch-control driving plate includes a thinned portion and a non-thinned portion, compared to the non-thinned portion, the thinned portion is adjacent to the display area. Along the first direction of the display area to the touch-control driving plate, the first direction is a direction perpendicular to the edge of the touch-control driving plate adjacent to the display area, the thinned portion extends to the edge of the touch-control driving plate adjacent to the display area. Since the thickness of the thinned portion of the touch-control driving plate is less than the thickness of the non-thinned portion of the touch-control driving plate, the height difference between the upper surface of the touch-control driving plate facing away from the second substrate and the second substrate gradually increases from the thinned portion to the non-thinned portion. The optical adhesive layer firstly fills the first height difference between the second substrate and the upper surface of the thinned portion and then fills the second height difference between the upper surface of the thinned portion and the upper surface of the non-thinned portion. That is, the optical adhesive layer gradually fills the two relatively small height differences. In this manner, it prevents at least one air bubble caused by filling an excessive height difference by the optical adhesive layer one time from generating between the optical adhesive layer and a lateral edge of the touch-control driving plate, and it prevents a gap caused by a poor alignment precision in attachment from generating between the optical adhesive layer and the lateral edge of the touch-control driving plate. Therefore, water vapour, oxygen or the like is prevented from getting into the display panel through the air bubble or the gap, the encapsulation reliability of the display panel will not be affected, and the service life of the display panel is prolonged.

BRIEF DESCRIPTION OF DRAWINGS

FIG. 1 is a structure view of a display panel.

FIG. 2 is a section view of a display panel according to an embodiment of the present disclosure.

DETAILED DESCRIPTION

Figure 3:
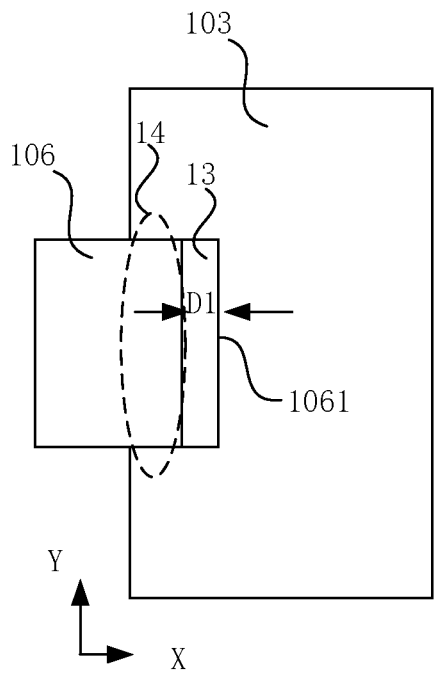
FIG. 3 is a top view of a display panel according to an embodiment of the present disclosure.

The present disclosure is described hereinafter in conjunction with drawings and embodiments. The embodiments described herein are intended to explain and not to limit the present disclosure. For ease of description, only part, not all, of structures related to the present disclosure are illustrated in the drawings.

For display panels of the related technology, for example, for a display panel with a touch-control function, there is need to reserve an area for binding touch-control driving plate, the area occupies a relatively large space. Other components (such as a polarizer) need to avoid the touch-control driving plate. As a result, the display panel has a relatively large bezel. FIG. 1 is a structure view of a display panel according to the related technology. As shown in FIG. 1, the display panel includes a first substrate 101, a light-emitting functional layer 102, a second substrate 103 and a polarizer 105, and the second substrate 103 is provided with a touch-control welding pad 202 for binding the second substrate 103 to a touch-control driving plate 106. A gap a1 is required between the boundary of the polarizer 105 in a non-display area and the boundary of the light-emitting functional layer 102 (the display area of the display panel) to ensure that light leak of the polarizer 105 is invisible in the display area. A preset distance a2 is required between the polarizer 105 and the touch-control driving plate 106 to avoid interference between the binding process of the touch-control driving plate 106 and the attaching process of the polarizer 105. The touch-control welding pad 202 needs to have a width a3 to ensure the stability of the electrical connection between the touch-control driving plate 106 and the touch-control welding pad 202. A distance a4 is required between the touch-control welding pad 202 and an edge of the second substrate 103 to ensure the stability of the touch-control welding pad 202 when the second substrate 103 is cut. Therefore, the width of the bezel of the display panel is at least a1+a2+a3+a4. This results in a relatively wide bezel.

In view of the preceding problem, the present disclosure provides the solution below.

FIG. 2 is a section view of a display panel according to an embodiment of the present disclosure. Referring to FIG. 2, this embodiment provides a display panel.

The display panel includes a first substrate 101, a light-emitting functional layer 102, a second substrate 103, an optical adhesive layer 104 and a polarizer 105 stacked in sequence.

The display panel includes a display area 11 and a non-display area 12 located on at least one side of the display area 11. The display panel further includes a touch-control driving plate 106 disposed on a surface of a first portion of the second substrate 103 facing away from the light-emitting functional layer 102. The first portion of the second substrate 103 is in the non-display area 12. The optical adhesive layer 104 covers a second portion of the touch-control driving plate 106.

The second portion of the touch-control driving plate 106 covered by the optical adhesive layer 104 includes a thinned portion 13 and a non-thinned portion 14. Along a first direction X of the display area 11 to the touch-control driving plate 106, the first direction X is a direction perpendicular to an edge of the touch-control driving plate 106 adjacent to the display area 11, the thinned portion 13 and the non-thinned portion 14 are arranged in sequence. Along a direction parallel to the second substrate 103 and along the first direction X, the thinned portion 13 extends to the edge of the touch-control driving plate 106 adjacent to the display area 11. Along a second direction perpendicular to the second substrate 103, a thickness of the thinned portion 13 of the touch-control driving plate 106 is less than a thickness of the non-thinned portion 14 of the touch-control driving plate 106.

The first substrate 101 may be an array substrate for driving the light-emitting functional layer 102 to emit light. The first substrate 101 includes a driver circuit layer. The light-emitting functional layer 102 may include an anode, a cathode and an organic light-emitting layer disposed between the anode and the cathode. The second substrate 103 may be an encapsulation substrate. When the display panel adopts a mutual capacitive touch-control electrode, the touch-control driving plate 106 is used for providing a touch-control driving signal to the touch-control electrode and receiving a touch-control sensing signal from the touch-control electrode. When the display panel adopts a self-contained touch-control electrode, the touch-control driving plate 106 is used for receiving a touch-control sensing signal from the touch-control electrode.

The optical adhesive layer 104 covers the touch-control driving plate 106. That is, the distance between the surface of the optical adhesive layer 104 facing away from the second substrate 103 and the second substrate 103 is greater than the distance between the surface of the touch-control driving plate 106 facing away from the second substrate 103 and the second substrate 103. Since the polarizer 105 is attached to the optical adhesive layer 104, the attaching surface between the polarizer 105 and the optical adhesive layer 104 is higher than the surface of the touch-control driving plate 106 facing away from the second substrate 103. When the polarizer 105 is attached to the surface of the optical adhesive layer 104, the edge of the polarizer 105 will not collide with the touch-control driving plate 106. That is, there is no need to reserve a preset distance between the touch-control driving plate 106 and the polarizer 105 to avoid interference between the binding process of the touch-control driving plate 106 and the attaching process of the polarizer 105. That is, along the direction parallel to the second substrate 103 and along the first direction X, the distance between the polarizer 105 and the touch-control driving plate 106 may be less than the preset distance, alternatively, the vertical projection of the polarizer 105 on the second substrate 103 may partially overlap the vertical projection of the touch-control driving plate 106 on the second substrate 103. In this manner, the bezel of the display panel is reduced, and the screen-to-body ratio of the display panel is improved. Here the preset distance is determined based on the alignment precision in attachment between the polarizer 105 and the touch-control driving plate 106 in the related technology. For example, the preset distance may be 0.2 mm.

Moreover, the touch-control driving plate 106 covered by the optical adhesive layer 104 includes a thinned portion 13 and a non-thinned portion 14, compared to the non-thinned portion 14, the thinned portion 13 is adjacent to the display area 11. Along the direction parallel to the second substrate 103 and along the first direction X, the thinned portion 13 extends to the edge of the touch-control driving plate 106 adjacent to the display area 11. Since the thickness of the thinned portion 13 of the touch-control driving plate 106 is less than the thickness of the non-thinned portion 14 of the touch-control driving plate 106, the height difference between the upper surface of the touch-control driving plate 106 facing away from the second substrate 103 and the second substrate 103 gradually increases from the thinned portion 13 to the non-thinned portion 14. The optical adhesive layer 104 firstly fills the first height difference between the second substrate 103 and the upper surface of the thinned portion 13 and then fills the second height difference between the upper surface of the thinned portion 13 and the upper surface of the non-thinned portion 14. That is, the optical adhesive layer 104 gradually fills the two relatively small height differences. In this manner, it prevents at least one air bubble caused by filling an excessive height difference by the optical adhesive layer 104 one time from generating between the optical adhesive layer 104 and the lateral edge of the touch-control driving plate 106, and it prevents a gap caused by a poor alignment precision in attachment from generating between the optical adhesive layer 104 and the lateral edge of the touch-control driving plate 106. Therefore, water vapour, oxygen or the like is prevented from getting into the display panel through the air bubble or the gap, and the encapsulation reliability of the display panel will not be affected, and the service life of the display panel is prolonged.

Moreover, the optical adhesive layer 104 covers a second portion of the touch-control driving plate 106, so that the attachable range of the polarizer 105 on the optical adhesive layer 104 is larger when the display panel is ensured to have a smaller bezel, thereby reducing the alignment difficulty in attachment, thus reducing difficulty in the attaching process and improving the yield of the display panel. Additionally, the optical adhesive layer 104 can protect and fix the touch-control driving plate 106, thereby increasing the reliability of the connection between the touch-control driving plate 106 and the second substrate, preventing the touch-control driving plate 106 from falling off or warping when the display panel is subjected to an external force, and improving the stability of the display panel.

Figure 4:
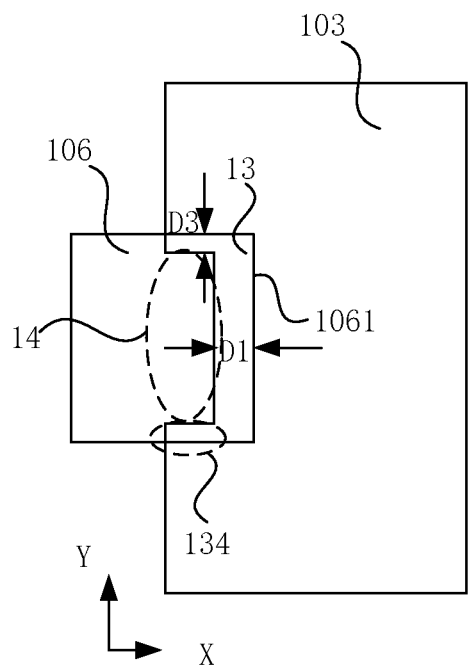
FIG. 4 is a top view of another display panel according to an embodiment of the present disclosure.

FIG. 3 is a top view of a display panel according to an embodiment of the present disclosure, and FIG. 4 is a top view of another display panel according to an embodiment of the present disclosure. Referring to FIGS. 3 and 4, along a third direction Y parallel to the edge 1061 of the touch-control driving plate 106 adjacent to the display area 11, the thinned portion 13 extends to two edges of the touch-control driving plate 106 which respectively intersect the edge 1061 of the touch-control driving plate 106 adjacent to the display area 11. That is, the maximum length of the thinned portion 13 is equal to the length of the touch-control driving plate 106.

With this arrangement, along the first direction X of the display area 11 to the touch-control driving plate 106, the first direction is a direction perpendicular to the edge of the touch-control driving plate 106 adjacent to the display area 11, the height difference of the entire lateral edge of the touch-control driving plate 106 in contact with the optical adhesive layer 104 may be decomposed into two smaller height differences. The optical adhesive layer 104 may fill the two smaller height differences in sequence to avoid at least one air bubble or a gap between this lateral edge of the touch-control driving plate 106 and the optical adhesive layer 104. Therefore, water vapour, oxygen or the like is prevented from getting into the display panel through the air bubble or the gap, and the encapsulation reliability of the display panel will not be affected, and the service life of the display panel is prolonged.

The shape of the surface of the thinned portion 13 facing away from the second substrate 103 may be rectangular or polygon.

Referring to FIG. 3, when the shape of the surface of the thinned portion 13 facing away from the second substrate 103 is rectangular, the difficulty in the manufacturing process of the thinned portion 13 can be reduced.

Referring to FIG. 4, the shape of the surface of the thinned portion 13 facing away from the second substrate 103 may be concave. The bottom of the concave is located at the edge 1061 of the touch-control driving plate 106 adjacent to the display area 11. The concave halfly surrounds the non-thinned portion 14.

With this arrangement, the optical adhesive layer 104 can fill two smaller height differences in sequence along both the first direction X and the third direction Y. it prevents at least one air bubble or a gap caused by filling an excessive height difference by the optical adhesive layer 104 one time from generating between the optical adhesive layer 104 and the lateral edge of the touch-control driving plate 106. Therefore, water vapour, oxygen or the like is prevented from getting into the display panel through the air bubble or the gap, and the encapsulation reliability of the display panel will not be affected, and the service life of the display panel is prolonged.

In an embodiment, referring to FIG. 4, along the first direction X of the display area 11 to the touch-control driving plate 106, the first direction X is a direction perpendicular to the edge of the touch-control driving plate 106 adjacent to the display area 11, the top of the concave extends to the edge of the non-thinned portion 14 facing away from the thinned portion 13. With this arrangement, along the third direction Y parallel to the edge 1061 of the touch-control driving plate 106 adjacent to the display area 11, the height difference between the optical adhesive layer 104 and the entire lateral edge of the touch-control driving plate 106 in contact with the optical adhesive layer 104 may be decomposed into two smaller height differences. In this manner, it prevents at least one air bubble or a gap from generating between this lateral edge of the touch-control driving plate 106 and the optical adhesive layer 104.

Figure 5:
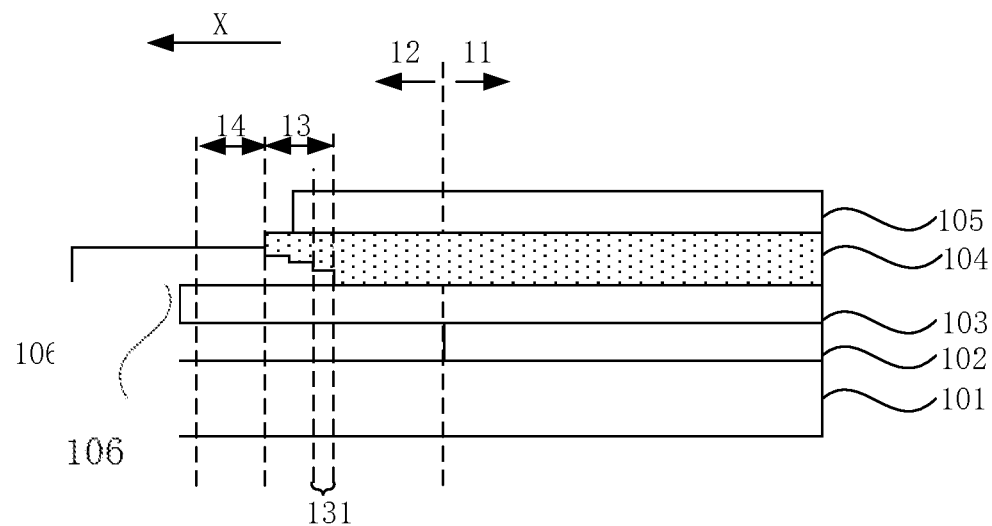
FIG. 5 is a section view of another display panel according to an embodiment of the present disclosure.

FIG. 5 is a section view of another display panel according to an embodiment of the present disclosure. In an embodiment, referring to FIG. 5, the thinned portion 13 includes at least two sub-thinned portions 131 connected to each other. Along the first direction X of the display area 11 to the touch-control driving plate 106, the first direction X is a direction perpendicular to the edge of the touch-control driving plate 106 adjacent to the display area 11, respective thicknesses of the at least two sub-thinned portions 131 of the touch-control driving plate 106 increase in sequence, the respective thickness is a thickness along the second direction perpendicular to the second substrate 103.

With this arrangement, along the direction from the thinned portion 13 to the non-thinned portion 14, the optical adhesive layer 104 fills a plurality of smaller height differences. The optical adhesive layer 104 climbs more easily when the height differences are smaller. For this reason, with the solution of this embodiment, it prevents at least one air bubble or a gap caused by filling an excessive height difference by the optical adhesive layer 104 one time from generating between the optical adhesive layer 104 and the lateral edge of the touch-control driving plate 106. Therefore, water vapour, oxygen or the like is prevented from getting into the display panel through the air bubble or the gap, and the encapsulation reliability of the display panel will not be affected, and the service life of the display panel is prolonged.

Figure 6:
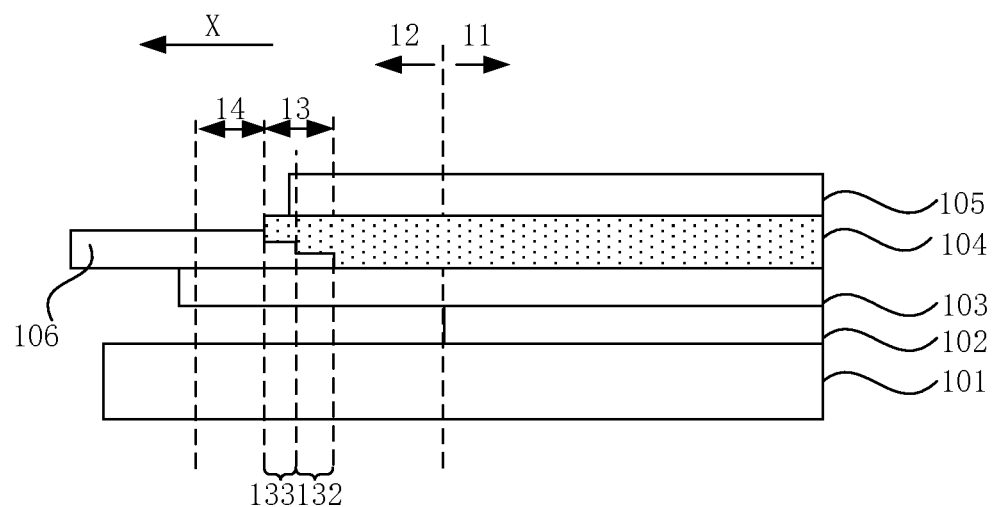
FIG. 6 is a section view of another display panel according to an embodiment of the present disclosure.

FIG. 6 is a section view of another display panel according to an embodiment of the present disclosure. In an embodiment, referring to FIG. 6, the thinned portion 13 includes a first sub-thinned portion 132 and a second sub-thinned portion 133 connected with each other. The first sub-thinned portion 132 is disposed on the side of the second sub-thinned portion 133 adjacent to the display area 11.

Along the second direction perpendicular to the second substrate 103, the thickness of the first sub-thinned portion 132 of the touch-control driving plate 106 is less than the thickness of the second sub-thinned portion 133 of the touch-control driving plate 106.

If the number of sub-thinned portions is excessively large, the requirements for the process are high and simplification of the process is adversely affected. With the arrangement in which the thinned portion 13 includes the first sub-thinned portion 132 and the second sub-thinned portion 133, a height difference filled by the optical adhesive layer 104 is relatively small, it prevents at least one air bubble or a gap caused by filling an excessive height difference by the optical adhesive layer 104 one time from generating between the optical adhesive layer 104 and the lateral edge of the touch-control driving plate 106, the manufacturing process is simplified, and the difficulty and cost of the process are reduced.

Figure 7:
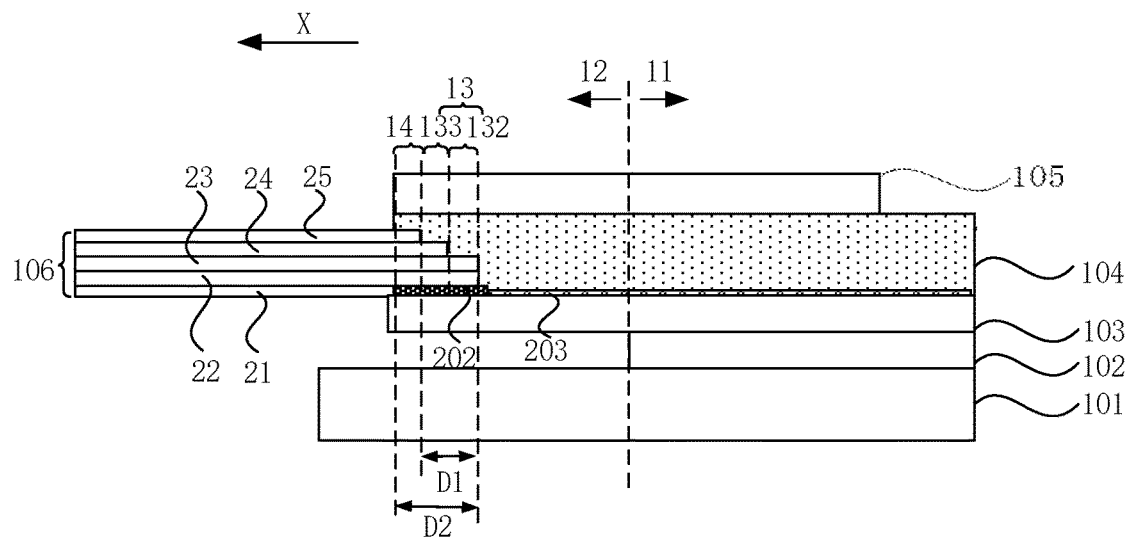
FIG. 7 is a section view of another display panel according to an embodiment of the present disclosure.

FIG. 7 is a section view of another display panel according to an embodiment of the present disclosure. In an embodiment, referring to FIG. 7, the touch-control driving plate 106 includes a first protective layer 21, a first metal layer 22, a base substrate 23, a second metal layer 24 and a second protective layer 25 stacked in sequence. The second protective layer 25 is disposed on the side of the second metal layer 24 facing away from the second substrate 103.

The first sub-thinned portion 132 does not include the second protective layer 25 and the second metal layer 24. The second sub-thinned portion 133 does not include the second protective layer 25.

The first metal layer 22 and the second metal layer 24 are wiring layers that may be made from copper or other materials. The material of the first protective layer 21 and the second protective layer 25 may be polyimide. A portion of the first protective layer 21 is removed, so that a portion of the first metal layer 22 is exposed. The exposed portion of the first metal layer 22 is bound to a touch-control welding pad 202 on the second substrate 103.

When the thinned portion 13 is manufactured, it is feasible to firstly remove the second protective layer 25 from the first sub-thinned portion 132 and the second sub-thinned portion 133 by using one photolithography process and then remove the second metal layer 24 from the first sub-thinned portion 132 by using one photolithography process. Thus, the first sub-thinned portion 132 does not include the second protective layer 25 and the second metal layer 24, the second sub-thinned portion 133 does not include the second protective layer 25. In this manner, the optical adhesive layer 104 can gradually fill smaller height differences, it prevents at least one air bubble or a gap caused by filling an excessive height difference by the optical adhesive layer 104 from generating between the optical adhesive layer 104 and the lateral edge of the touch-control driving plate 106, the manufacturing process is simplified, and the difficulty and cost of the process are reduced.

In an embodiment, referring to FIG. 7, along the first direction X of the display area 11 to the touch-control driving plate 106, the first direction X is a direction perpendicular to the edge of the touch-control driving plate 106 adjacent to the display area 11, a ratio of a width D1 of the thinned portion 13 to a binding width D2 between the touch-control driving plate 106 and the second substrate 103 is greater than or equal to ¼ and less than or equal to ¾.

The binding width D2 is a width of an overlapping area between the vertical projection of the touch-control driving plate 106 on the second substrate 103 and the touch-control welding pad 202 of the second substrate 103. When the width of the thinned portion 13 is smaller, the buffering effect on a height difference is smaller. When the width of the thinned portion 13 is excessively large, the thickness of the binding area of the touch-control driving plate 106 is excessively thin, resulting in that the touch-control driving plate 106 has a smaller structural strength, and the touch-control driving plate 106 is easily deformed or broken when subjected to an external force. The ratio of the width D1 of the thinned portion 13 to the binding width D2 is greater than or equal to ¼ and less than or equal to ¾, so that it is ensured that the thinned portion 13 has a relatively good buffering effect on a height difference, and the touch-control driving plate 106 has a relatively high structural strength.

In an embodiment, continue to refer to FIGS. 3 and 4, when the shape of the surface of the thinned portion 13 facing away from the second substrate 103 is rectangular, the width D1 of the thinned portion 13 is a width of the rectangle along the first direction X, and when the shape of the surface of the thinned portion 13 facing away from the second substrate 103 is concave, the width D1 of the thinned portion 13 is the minimum width of the concave along the first direction X. Moreover, referring to FIG. 4, when the shape of the surface of the thinned portion 13 facing away from the second substrate 103 is concave, respective widths D3 of two protrusions 134 of the concave may be the same along the third direction Y parallel to the edge 1061 of the touch-control driving plate 106 adjacent to the display area 11, and a sum of the widths D3 of the two protrusions 134 may be equal to the width D1 of the thinned portion 13, it is ensured that the touch-control driving plate 106 has a relatively good structural stability. In an embodiment, continue to refer to FIG. 7, along the first direction X of the display area 11 to the touch-control driving plate 106, the first direction X is perpendicular to the edge of the touch-control driving plate 106 adjacent to the display area 11, the range of the width of the first sub-thinned portion 132 is 50 um to 100 um, and the range of the width of the second sub-thinned portion 133 is 50 um to 100 um.

With this arrangement, it is ensured that the thinned portion 13 has a relatively good buffering effect on a height difference, the touch-control driving plate 106 has a relatively good structural strength, and the difficulty and cost of the manufacturing process are reduced.

In an embodiment, the vertical projection of the polarizer 105 on the second substrate 103 partially overlaps the vertical projection of the touch-control driving plate 106 on the second substrate 103.

With this arrangement, there is no gap between the polarizer 105 and the touch-control driving plate 106 along a direction of the display area 11 to the non-display area 12, and the direction is parallel to the second substrate 103, and the sum of the width of the polarizer 105 in the non-display area 12 and the binding length between the touch-control driving plate 106 and the second substrate 103 is reduced. In this manner, the bezel of the display panel is reduced, and the screen-to-body ratio of the display panel is improved.

In an embodiment, a material of the optical adhesive layer 104 is a heat curing adhesive.

Since the optical adhesive layer 104 is used for attaching to the polarizer 105, a general attaching process is firstly place the polarizer 105 on an uncured optical adhesive layer 104 and then cure the optical adhesive layer 104. Since the polarizer 105 can change the polarization characteristics of light, if the ultraviolet curing method is adopted, the ultraviolet light may not completely cure the optical adhesive layer 104 due to the effect of the polarizer 105, thereby affecting the attaching effect. Using the heat curing adhesive in the optical adhesive layer 104 can ensure a better curing effect of the optical adhesive layer 104, and the binding stability of the polarizer 105 is ensured.

Figure 8:
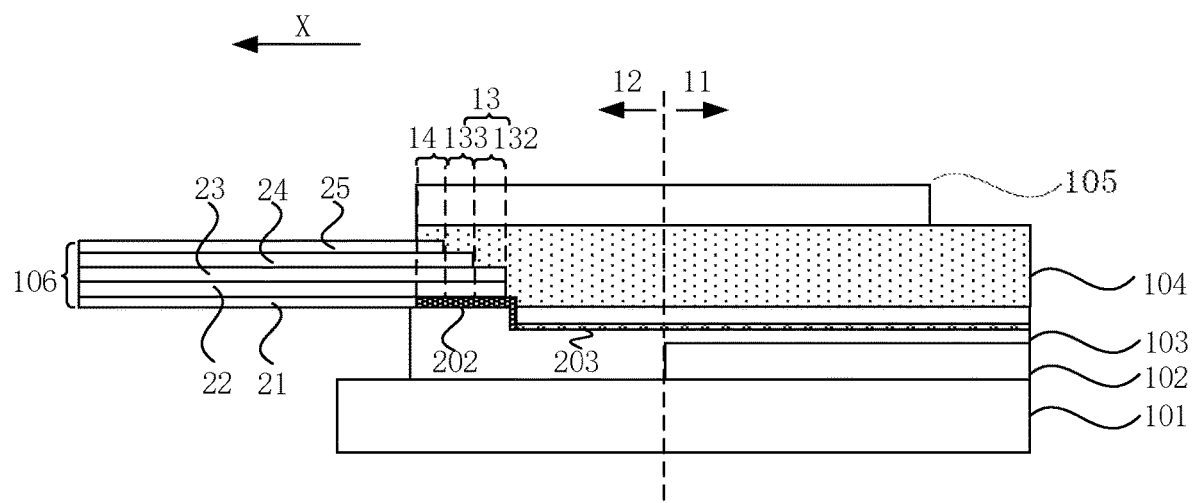
FIG. 8 is a section view of another display panel according to an embodiment of the present disclosure.

FIG. 8 is a section view of another display panel according to an embodiment of the present disclosure. In an embodiment, referring to FIGS. 7 and 8, the second substrate 103 includes a touch-control welding pad 202 and a touch-control electrode layer 203. The touch-control welding pad 202 is electrically connected to the touch-control driving plate 106. The touch-control electrode layer 203 is electrically connected to the touch-control welding pad 202 through at least one touch-control lead. The second substrate 103 further includes an encapsulation glass or a thin-film encapsulation layer.

The touch-control electrode layer 203 is disposed on the surface of the encapsulation glass facing away from the first substrate 101 (FIG. 7). Alternatively, the touch-control electrode layer 203 is disposed on the surface of the thin-film encapsulation layer facing away from the first substrate 101, or the touch-control electrode layer 203 is disposed in the thin-film encapsulation layer (FIG. 8).

The touch-control welding pad 202 is disposed on the surface of the second substrate 103 facing away from the first substrate 101, this facilitates a bind between the touch-control welding pad 202 and the touch-control driving plate 106. The touch-control electrode layer 203 may be disposed in the second substrate 103 or on a surface of the second substrate 103. The touch-control electrode layer 203 includes a plurality of touch-control electrodes.

Referring to FIG. 7, the second substrate 103 is an encapsulation substrate. When the display panel is encapsulated by glass, the second substrate 103 includes an encapsulation glass. The touch-control electrode layer 203 may be formed on a surface of the encapsulation glass and electrically connected to the touch-control driving plate 106 through the touch-control welding pad 202. Referring to FIG. 8, when the display panel is encapsulated by a thin film, the second substrate 103 includes a thin-film encapsulation layer, and the touch-control electrode layer 203 may be formed on a surface of the thin-film encapsulation layer or in the thin-film encapsulation layer. With the touch-control electrode layer 203 disposed on the surface of the second substrate 103 or in the second substrate 103, the display panel has a relatively small thickness, it conforms to the development trend of light and thin display panel.

Figure 9:
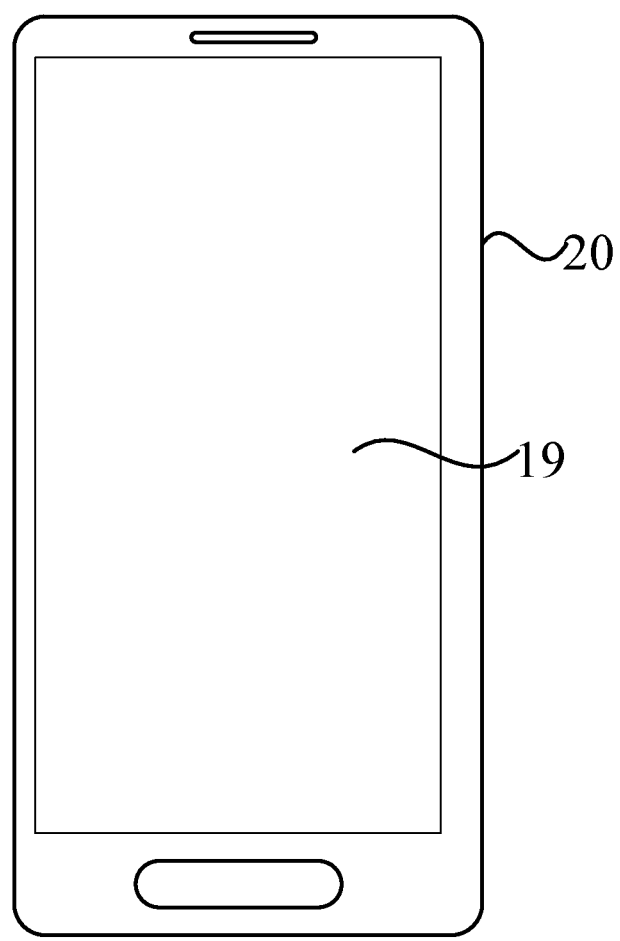
FIG. 9 is a structure view of a display device according to an embodiment of the present disclosure.

FIG. 9 is a structure view of a display device according to an embodiment of the present disclosure. Referring to FIG. 9, the display device 20 includes the display panel 19 provided in any embodiment of the present disclosure. The display device provided in any embodiment of the present disclosure may be a display device having a display function, such as a mobile phone, a computer or a smart wearable device, the embodiments of the present application are not limited to these.

The display device provided in this embodiment includes the display panel provided in any embodiment of the present disclosure and has the same functions and effects as the display panel provided in any embodiment of the present disclosure. These functions and effects are not repeated here.

What is claimed is:

1. A display panel, comprising:
a first substrate, a light-emitting functional layer, a second substrate, an optical adhesive layer and a polarizer stacked in sequence,
wherein the display panel comprises a display area and a non-display area located on at least one side of the display area;
the display panel further comprises a touch-control driving plate disposed on a surface of a first portion of the second substrate facing away from the light-emitting functional layer, the first portion of the second substrate is in the non-display area; the optical adhesive layer covers a second portion of the touch-control driving plate; and
wherein the second portion of the touch-control driving plate covered by the optical adhesive layer comprises a thinned portion and a non-thinned portion; along a first direction of the display area to the touch-control driving plate, the thinned portion and the non-thinned portion are arranged in sequence, and the thinned portion extends to an edge of the touch-control driving plate adjacent to the display area; along a second direction perpendicular to the second substrate, a thickness of the thinned portion of the touch-control driving plate is less than a thickness of the non-thinned portion of the touch-control driving plate, wherein
the thinned portion comprises at least two sub-thinned portions connected with each other; along the first direction of the display area to the touch-control driving plate, thicknesses of the at least two sub-thinned portions of the touch-control driving plate increase in sequence;
the thinned portion comprises a first sub-thinned portion and a second sub-thinned portion connected to each other, and the first sub-thinned portion is disposed on a side of the second sub-thinned portion adjacent to the display area;
along the second direction perpendicular to the second substrate, a thickness of the first sub-thinned portion of the touch-control driving plate is less than a thickness of the second sub-thinned portion of the touch-control driving plate;
the touch-control driving plate comprises a first protective layer, a first metal layer, a base substrate, a second metal layer and a second protective layer stacked in sequence, wherein the second protective layer is disposed on a side of the second metal layer facing away from the second substrate; and
the first sub-thinned portion does not comprise the second protective layer and the second metal layer, and the second sub-thinned portion does not comprise the second protective layer.

2. The display panel of claim 1, wherein the first direction is a direction perpendicular to the edge of the touch-control driving plate adjacent to the display area.

3. The display panel of claim 1, wherein
along a third direction parallel to the edge of the touch-control driving plate adjacent to the display area, the thinned portion extends to two edges of the touch-control driving plate which respectively intersect with the edge of the touch-control driving plate adjacent to the display area.

4. The display panel of claim 1, wherein
a shape of a surface of the thinned portion facing away from the second substrate is concave.

5. The display panel of claim 1, wherein
a shape of a surface of the thinned portion facing away from the second substrate is concave, and
a bottom of the concave is located at the edge of the touch-control driving plate adjacent to the display area.

6. The display panel of claim 1, wherein
along the first direction of the display area towards the touch-control driving plate, a ratio of a width of the thinned portion to a binding width between the touch-control driving plate and the second substrate is greater than or equal to ¼ and less than or equal to ¾.

7. The display panel of claim 6, wherein
along the first direction of the display area towards the touch-control driving plate, a range of a width of the first sub-thinned portion is 50 um to 100 um, and a range of a width of the second sub-thinned portion is 50 um to 100 um.

8. The display panel of claim 1, wherein
a vertical projection of the polarizer on the second substrate partially overlaps a vertical projection of the touch-control driving plate on the second substrate.

9. The display panel of claim 1, wherein
a material of the optical adhesive layer is a heat curing adhesive.

10. The display panel of claim 1, wherein
the second substrate comprises at least one touch-control welding pad and a touch-control electrode layer, the at least one touch-control welding pad is electrically connected to the touch-control driving plate, and the touch-control electrode layer is electrically connected to the at least one touch-control welding pad through at least one touch-control lead.

11. The display panel of claim 10, wherein
the second substrate further comprises an encapsulation glass, and the touch-control electrode layer is disposed on a surface of the encapsulation glass facing away from the first substrate.

12. The display panel of claim 10, wherein
the second substrate further comprises a thin-film encapsulation layer, and the touch-control electrode layer is disposed on a surface of the thin-film encapsulation layer facing away from the first substrate, or the touch-control electrode layer is disposed in the thin-film encapsulation layer.

13. A display device, comprising a display panel of claim 1.

14. A display panel, comprising:
a first substrate, a light-emitting functional layer, a second substrate, an optical adhesive layer and a polarizer stacked in sequence,
wherein the display panel comprises a display area and a non-display area located on at least one side of the display area;

the display panel further comprises a touch-control driving plate disposed on a surface of a first portion of the second substrate facing away from the light-emitting functional layer, the first portion of the second substrate is in the non-display area; the optical adhesive layer covers a second portion of the touch-control driving plate; and wherein the second portion of the touch-control driving plate covered by the optical adhesive layer comprises a thinned portion and a non-thinned portion; along a first direction of the display area to the touch-control driving plate, the thinned portion and the non-thinned portion are arranged in sequence, and the thinned portion extends to an edge of the touch-control driving plate adjacent to the display area; along a second direction perpendicular to the second substrate, a thickness of the thinned portion of the touch-control driving plate is less than a thickness of the non-thinned portion of the touch-control driving plate; wherein the thinned portion comprises a first sub-thinned portion and a second sub-thinned portion connected to each other, the touch-control driving plate comprises a first protective layer, a first metal layer, a base substrate, a second metal layer and a second protective layer stacked in sequence, wherein the second protective layer is disposed on a side of the second metal layer facing away from the second substrate; and the first sub-thinned portion does not comprise the second protective layer and the second metal layer, and the second sub-thinned portion does not comprise the second protective layer.

15. The display panel of claim 14, wherein the thinned portion comprises at least two sub-thinned portions connected with each other; along the first direction of the display area to the touch-control driving plate, thicknesses of the at least two sub-thinned portions of the touch-control driving plate increase in sequence.

16. The display panel of claim 14, wherein the first sub-thinned portion is disposed on a side of the second sub-thinned portion adjacent to the display area.

17. The display panel of claim 14, wherein
along the second direction perpendicular to the second substrate, a thickness of the first sub-thinned portion of the touch-control driving plate is less than a thickness of the second sub-thinned portion of the touch-control driving plate.

* * * * *